US005574252A

United States Patent [19]

Hill

[11] Patent Number: 5,574,252

[45] Date of Patent: Nov. 12, 1996

[54] METHOD AND APPARATUS FOR ELECTRICALLY AND MECHANICALLY INTERCONNECTING ELECTRICAL COMPONENTS

[75] Inventor: Douglas J. Hill, Renton, Wash.

[73] Assignee: Physio-Control Corporation, Redmond, Wash.

[21] Appl. No.: 207,854

[22] Filed: Mar. 8, 1994

[51] Int. Cl.⁶ .................................................. H05K 5/02
[52] U.S. Cl. .......................... 174/51; 174/52.1; 361/681
[58] Field of Search ............................. 174/50, 51, 52.1; 464/29; 361/393, 394, 681, 682

[56] References Cited

U.S. PATENT DOCUMENTS

| 4,864,523 | 9/1989  | Sasaki          | 364/708   |
|-----------|---------|-----------------|-----------|
| 5,043,846 | 8/1991  | Kinoshita       | 361/394   |
| 5,173,837 | 12/1992 | Blackwell et al.| 361/380   |
| 5,196,993 | 3/1993  | Herron et al.   | 361/393   |
| 5,278,725 | 1/1994  | Konno et al.    | 361/680   |
| 5,333,356 | 8/1994  | Katagiri        | 16/340    |
| 5,383,139 | 1/1995  | Saji et al.     | 364/708.1 |
| 5,436,792 | 7/1995  | Leman et al.    | 361/686   |

FOREIGN PATENT DOCUMENTS

| 0464767A1  | 1/1992 | France  | H01R 35/02 |
|------------|--------|---------|------------|
| 2034514    | 3/1971 | Germany | H01R 35/02 |
| WO90/10960 | 9/1990 | WIPO    | H01R 39/00 |

Primary Examiner—Kristine L. Kincaid
Assistant Examiner—Michael J. Cornelison
Attorney, Agent, or Firm—Christensen O'Connor Johnson & Kindness PLLC

[57] ABSTRACT

A portable electronic device having a stationary housing enclosing a first electric circuit and a pivotable housing enclosing a second electric circuit, uses a mechanical and electrical interconnection assembly for interconnecting the two housings and circuits. The mechanical assembly includes a pivot and friction assembly that pivotally couples the stationary and pivotal housings together, and allows the pivotable housing to be held at a variety of angular orientations with respect to the stationary housing. The electrical assembly includes an electrical connector of a flexible web type that pivotally and electrically connects the first and second electric circuits together. Rather than pivoting at the pivot point or axis, the electrical connector pivots about or along a relatively great distance compared to the pivot axis, thereby greatly reducing the possibility of the electrical conductor breaking at the pivot.

20 Claims, 6 Drawing Sheets

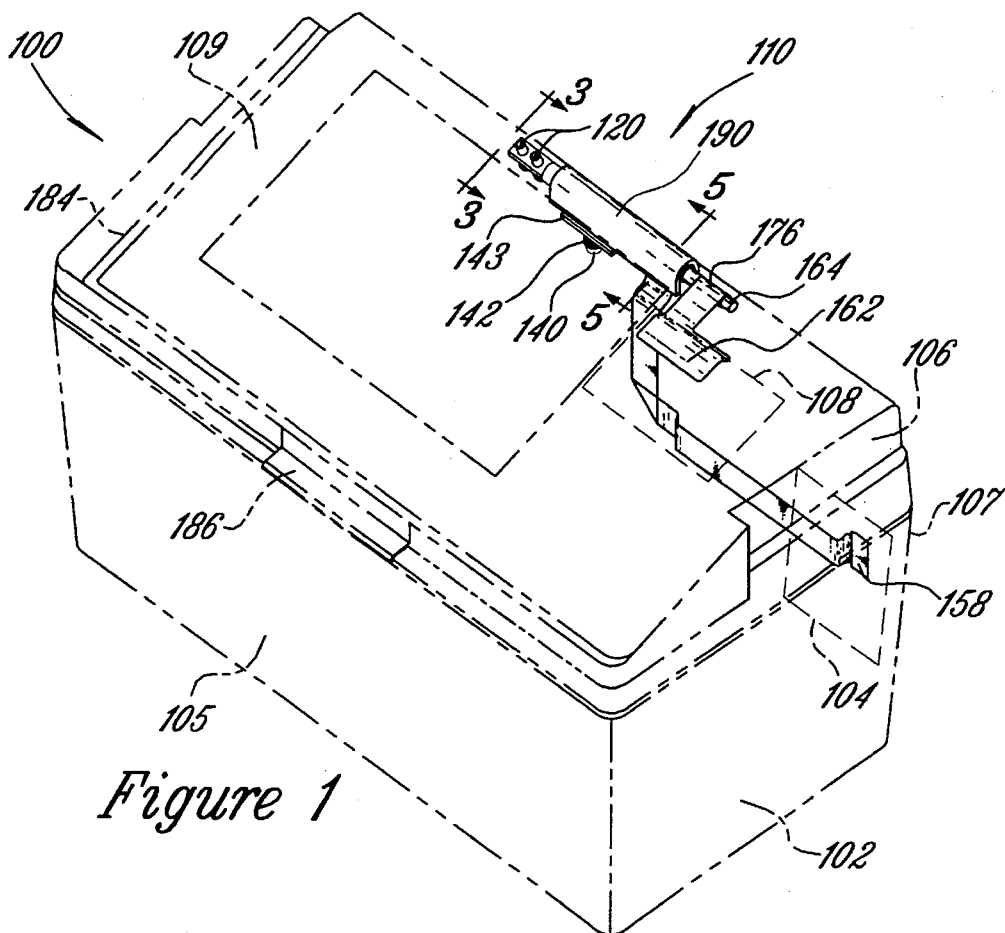
Figure 1
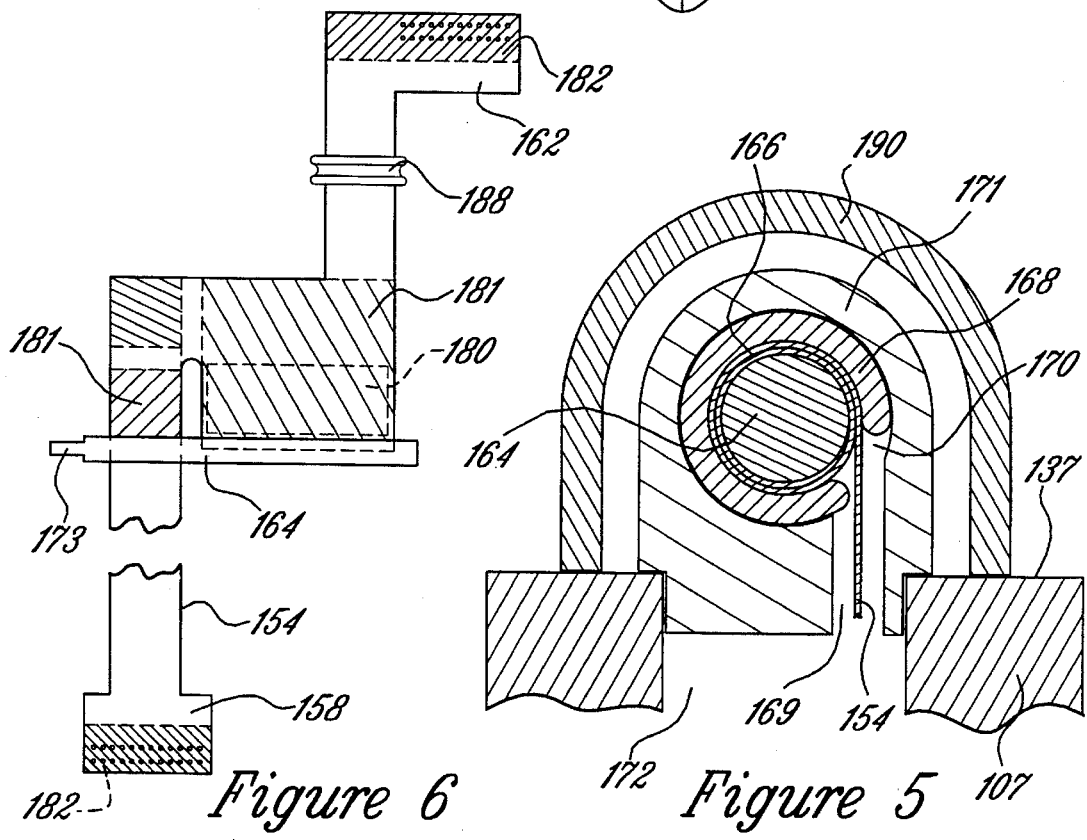
Figure 6
Figure 5

METHOD AND APPARATUS FOR ELECTRICALLY AND MECHANICALLY INTERCONNECTING ELECTRICAL COMPONENTS

TECHNICAL FIELD

The present invention relates to methods and apparatus for electrically and mechanically interconnecting electrical components, particularly electrical components connected together by means of a pivoting hinge.

BACKGROUND OF THE INVENTION

A wide variety of pivoting mechanisms or hinges currently exist for pivotally coupling two mechanisms or components. For example, a box may include a lid pivotally connected to the box with a hinge. If the lid is to have only two rest positions, i.e., an "open" and a "closed" position, most of the currently available hinges may be used. However, if the lid is also to be held at a variety of angles with respect to the box, then an appropriate system must be added to the hinge to hold the lid stationary at each angle. The system may be a friction system that inhibits the hinge from pivoting freely by adding a sufficient frictional force to the hinge to allow the lid to be held in a variety of angular orientations with respect to the box. For example, a hinge pin in the hinge may be tightened to allow the lid to be held "half-open" or at a variety of acute angles with respect to the box.

Most hinges must be able to withstand innumerable actuations. Coupled with a friction system, the hinge must also permit the lid to remain half-open or in a variety of positions after a great number of actuations. The amount of force required to pivot the lid must not significantly increase or decrease during the life of the hinge and/or friction system or the device to which they are attached. Any friction system can cause undue wear on the hinge device because of the frictional forces the system creates. Over time, these forces can wear away at the hinge, causing the amount of required pivoting force to significantly increase or decrease. Consequently, the friction system and/or the hinge can require frequent replacement during heavy use or during the life of the device to which they are affixed. Some ratcheting or locking pivot mechanisms are currently available that have a longer life and can be used instead of a friction system. These ratcheting or locking mechanisms are often complex, expensive, and permit only a discrete number of angular orientations (i.e. the lid may be held open in only a few positions).

If two electrical devices are to be pivotally interconnected, additional problems arise. An electrical conductor must be used to electrically interconnect the two electrical devices. For example, an electrical device may include a keypad or other input device pivotably connected to the electronic device with a hinge. An electrical conductor electrically intercouples the keypad with the electronic device. If the keypad is frequently pivoted back and forth, then a simple wire is insufficient for electrically intercoupling the keypad to the device because it will break after repeatedly being bent back and forth at the hinge point. Some currently available electrical connectors for intercoupling two electrical components permit rotation or pivoting between the two components. Typically, these pivotable connectors use brushes or spring-loaded electrical contacts; however, the brushes or contacts suffer from wear, corrosion, and/or decreased conductivity when repeatedly pivoted or rotated. The pivotable electrical connectors, therefore, generally have a limited useful life or must be frequently maintained. In addition, the pivotable connectors are expensive.

Any hinge pivotally connecting the keypad to the electronic device must not interfere with the electrical connector. Furthermore, if the keypad is to be held in a variety of angular orientations with respect to the electrical device, any friction system for permitting such angular orientation must also not interfere with the electrical conductor. The hinge and/or friction system must nevertheless still permit the keyboard to remain in a variety of positions after a great number of actuations, and the force required to pivot the keyboard must not significantly increase or decrease.

If the electrical device is to be portable, the electrical connector and the hinge must be ragged enough to withstand rough handling during active use. To be portable, the electrical device must generally be compact and lightweight to allow it to be readily portable. As a result, heavy or bulky electrical connectors, hinges or friction systems may not be used. The electrical connector, hinge and friction system must generally be accommodated within a small space in the electrical device. Furthermore, if the portable electronic device is to be used outdoors or in a variety of environmental conditions, the device must be environmentally secure. The device must be able to resist the penetration of moisture or other fluids into the electronic circuitry of the device. If the device lacks any pivotable electrical components, the device can be more easily designed to be environmentally sealed. When pivotally intercoupling two electrical devices, however, ports or openings for receiving the electrical conductor are formed in housings containing the two electrical devices. These openings allow water to penetrate into the housings and destroy the electrical devices. Additionally, the pivotable electrical connectors are particularly susceptible to damage when openly exposed to various environmental conditions. Consequently, for an electronic device to be environmentally secure, it generally cannot include pivotably interconnected to electronic components.

Overall, the inventors are unaware of any portable electronic device that combines a durable hinge having a friction system with an equally durable pivotable electrical interconnector in a compact manner without interfering with each other and in an environmentally secure manner.

SUMMARY OF THE INVENTION

According to principles of the present invention, a portable electronic device having a stationary or first housing enclosing a first electric circuit or component, and a pivotable or second housing enclosing a second electric circuit or component, uses a mechanical and electrical interconnection assembly for interconnecting the two housings and circuits. The mechanical assembly includes a pivot and friction assembly that pivotally couples the stationary and pivotable housings together at an axis of rotation, and allows the pivotable housing to be held at a variety of angular orientations with respect to the stationary housing. The electrical assembly includes an electrical connector of a flexible web type that pivotally and electrically connects the first and second electric circuits together.

The electrical conductor is coupled to the first electrical circuit at a first end and the second electrical circuit at a second end, the first and second ends being axially offset from each other. A central portion of the electrical conductor rotates about the axis of rotation so that the electrical conductor wraps or unwraps about the axis of rotation as the stationary and pivotable housings pivot with respect to each other. In one embodiment, a first portion of the electrical conductor is wrapped in at least one complete loop having an axis that is substantially coincident with the axis of rotation of the pivot assembly so that the electrical conductor winds and unwinds as the first and second housings pivot with respect to each other. In an alternative embodiment, the central portion of the electrical conductor helically rotates about the axis of rotation so that the electrical conductor moves from an approximately flat first position to a partially twisted second position about the axis of rotation as the stationary and pivotable housings pivot with respect to each other.

The mechanical and electrical assembly also includes a friction assembly having a friction member and an adjusting member. The friction member is in frictional contact with a first hinge member of the pivot assembly, and the adjusting member is coupled between the friction member and the stationary or pivotable housing. The adjusting member is for adjusting an amount of frictional contact between the friction member and the first hinge member.

BRIEF DESCRIPTION OF THE DRAWINGS

FIG. 1 is an isometric front view of a portable medical electronic device of the present invention having a mechanical and electrical interconnection assembly.

FIG. 5 is a enlarged cross-sectional view of a portion of the electrical interconnection assembly taken along the line 5—5 of FIG. 1.

FIG. 6 is a top plan view of a flexible electrical conductor and mandrel around which it is wound of the electrical interconnection assembly of FIG. 1.

DETAILED DESCRIPTION OF THE PRESENTLY PREFERRED EMBODIMENT

Figure 2:
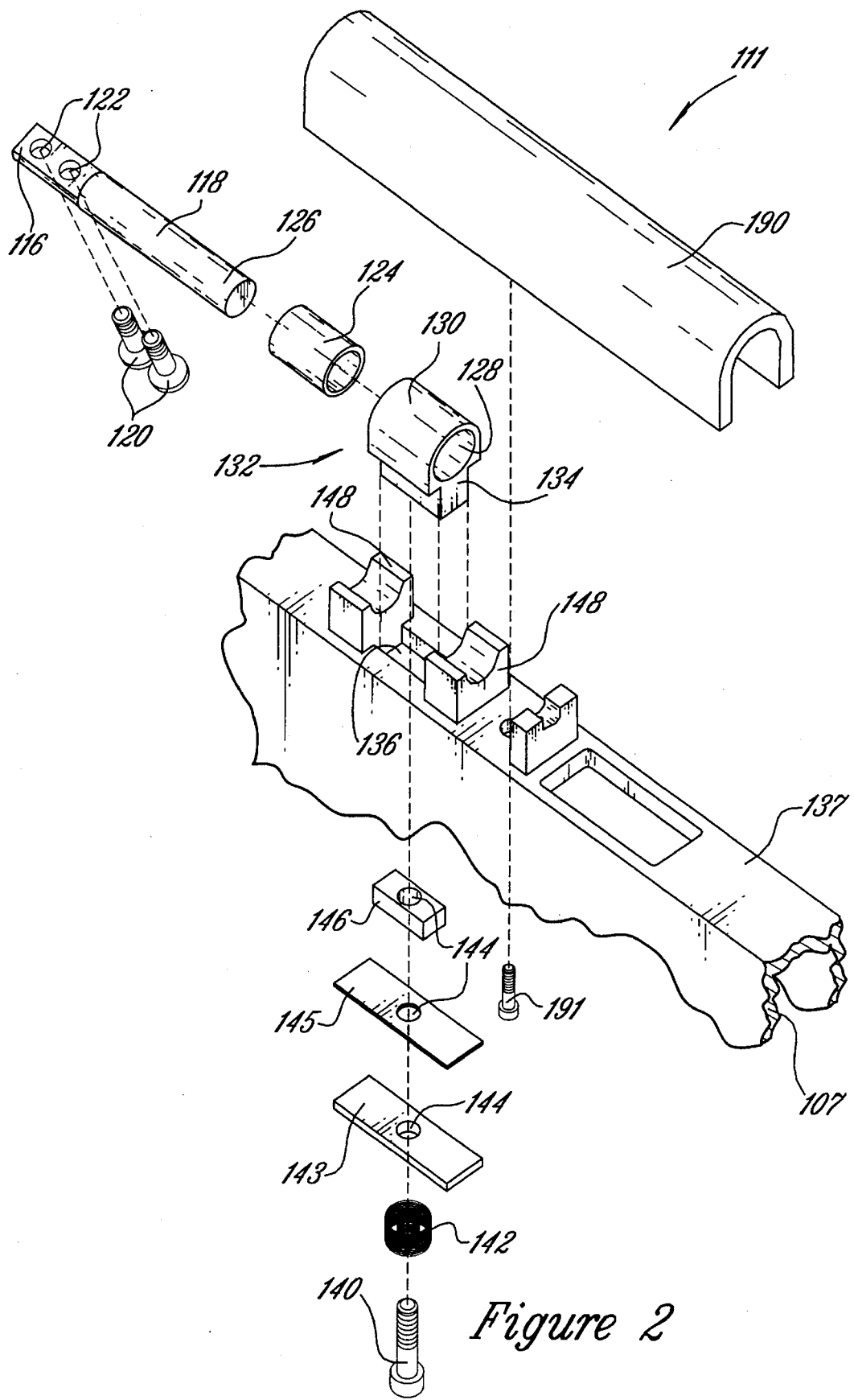
FIG. 2 is an exploded isometric view of the mechanical interconnection assembly of FIG. 1.

A portable medical electronic device 100, such as a defibrillator or medical monitor, is shown in FIG. 1 as having a lower housing 102 enclosing a medical electronic component or primary electrical circuit 104. The medical electronic device 100 further includes an upper housing or lid 106 enclosing another medical electronic component or secondary electrical circuit 108. The lid 106 and the lower housing 102 together form a front side 105, a rear side 107, a top side 109, and bottom, left and right sides of the portable electronic device 100. An interconnection assembly 110 electrically and mechanically interconnects the lid 106 with the lower housing 102. The interconnection assembly 110 includes a mechanical interconnection assembly 111 (shown in FIGS. 2–3) and an interrelated electrical interconnection assembly 112 (shown in FIGS. 4–6).

Figure 3:
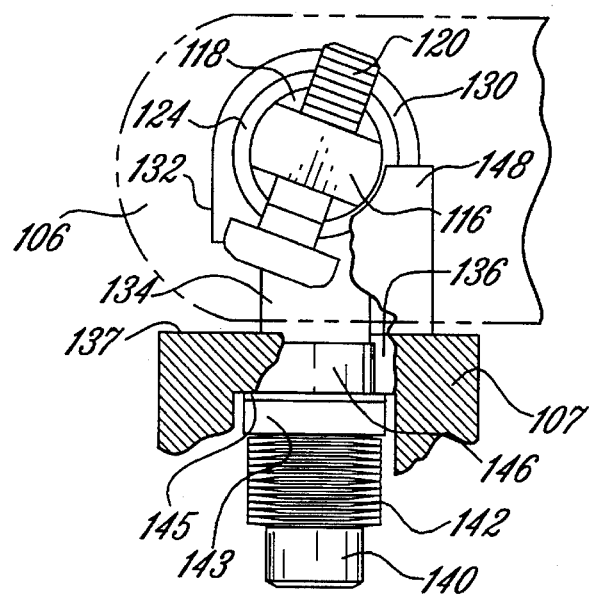
FIG. 3 is an enlarged, partial fragmentary, cross-sectional view of a portion of the mechanical interconnection assembly taken along the line 3—3 of FIG. 1.

Referring to FIGS. 2 and 3, the mechanical interconnection assembly 111 provides a means of pivotally interconnecting the lid 106 to the lower housing 102 and permits the lid to be held in a variety of angular orientations with respect to the lower housing 102. A pair of screws 120, received by a pair of screw holes 122 in a retaining end 116 of a hinge pin 118, secure the hinge pin 118 to the lid 106 (as shown in FIG. 1). Although screws are generally used in the present invention, other means of fixing or interconnecting components may be used as is known by those skilled in the relevant art. A free end 126 of the hinge pin 118 is inserted into a bushing 124, and a cylindrical bore 128 formed in an upper head portion 130 of a friction member 132 axially receives the bushing 124 and the free end 126 of the hinge pin 118 (as shown in FIG. 3). The bushing 124 is preferably fixed to the head portion 130.

A friction member opening 136 formed in an upper edge 137 of the rear side 107 of the lower housing 102 receives a lower fastening portion 134 of the friction member 132. An adjusting member or screw 140, axially receiving a spring 142, is positioned through screw holes 144 centrally formed in a retaining plate 143, a gasket plate 145 and a block seal 146. The screw 140 is adjustably fixed to the fastening portion 134 of the friction member 132. When so fixed, the retaining plate 143 rests against the gasket plate 145 which in turn rests along an underside of the upper edge 137 of the rear side 107, retaining the lid 106, the hinge pin 118, and the friction member 132 to the lower housing 102.

Figure 7:
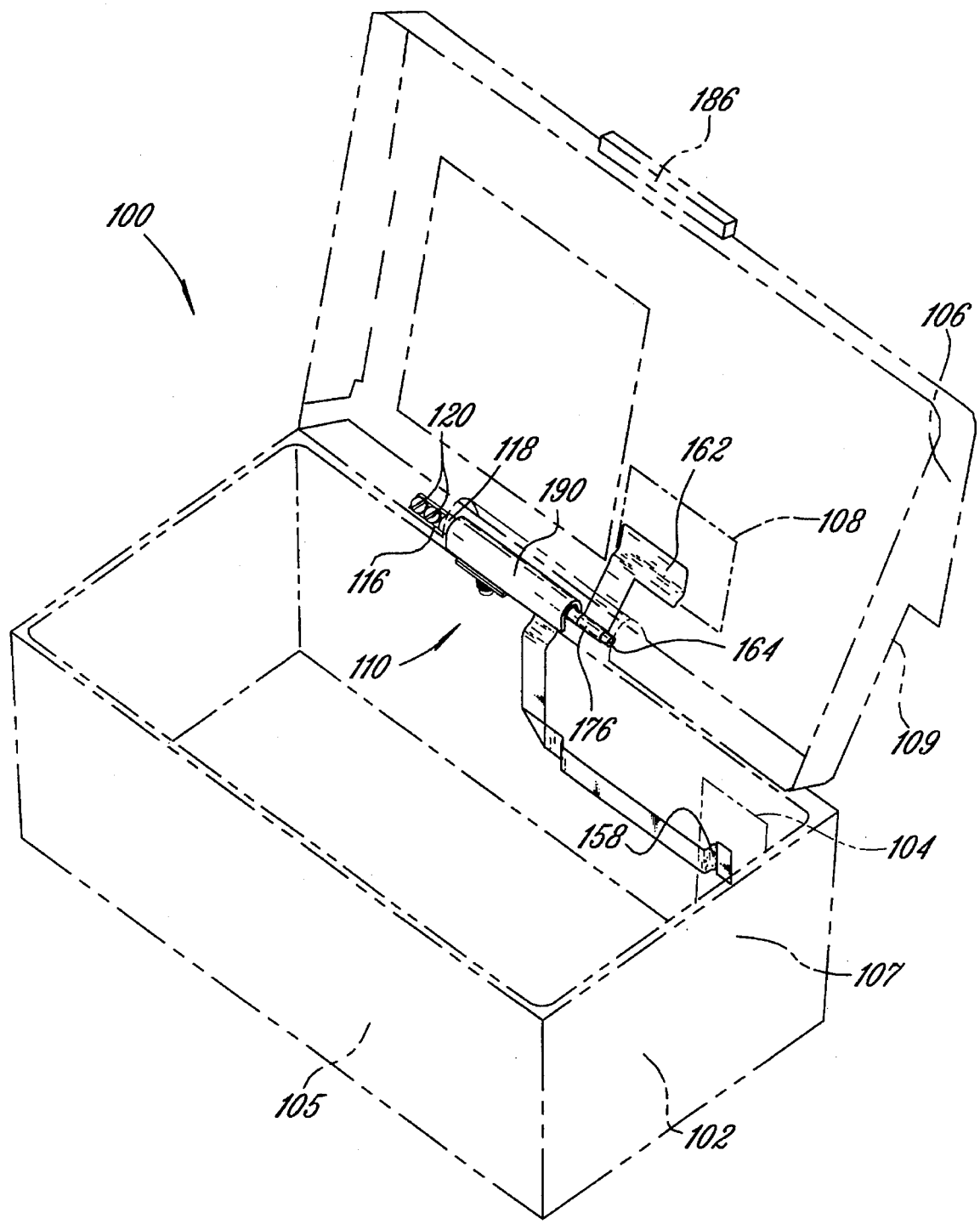
FIG. 7 is an isometric front view of the medical device of FIG. 1 showing the lid pivoted upward.

When so retained, left and right hinge pin supports 148, which project upward from the upper edge 137 of the rear side 107 about the friction member opening 136, receive the free end 126 and a middle portion of the hinge pin 118. The lid 106 is thereby retained along the upper edge 137 of the rear side 107 of the lower housing 102. As the lid 106 is pivoted, the hinge pin 118 rotates with respect to the bushing 124 on the left and right hinge pin supports 148 (compare FIGS. 1 and 7). The lid 106 can pivot approximately 180°, from a 0° or fully closed position when the lid 106 contacts substantially all of the upper surface of the lower housing 102, and a 180° or fully open position when the lid 106 is pivoted rearward and the top side 109 contacts the upper edge 137 of the rear side 107.

When the screw 140 is tightened or adjusted, the friction member 132 is drawn downward, drawing the hinge pin 118 downward into the left and right hinge pin supports 148, causing frictional forces between the hinge pin 118 and the bushing 124 to increase. The screw 140 may be tightened a sufficient amount to impose enough frictional force between the bushing 124 and the hinge pin 118 to restrict pivotal movement of the lid 106 and allow the lid to be held in a variety of angular orientations with respect to the lower housing 102. The hinge pin 118 is preferably made of stainless steel, while the bushing 124 is preferably made of bronze to provide a balance between increased friction and decreased wear therebetween. Other materials known by those skilled in the relevant art may be substituted to provide the appropriate friction versus wear balance.

To prevent water or other contaminants from penetrating into the housing 102, the block seal 146 substantially fills the friction member opening 136. To further prevent contaminants from penetrating into the housing 102, the gasket plate 145 seals the friction member opening 136 from below the fastening portion 134 of the friction member 132. The gasket plate 145 and the block seal 146 are preferably made of a resilient material such as closed-cell foam. When the screw 140 is fixed to the fastening portion 134 of the friction member 132 and tightened, the gasket plate 145 and the block seal 146 are centrally compressed, causing them to expand outward to fill the friction member opening 136 and inward to fill the screw holes 144, thereby forming an environmental seal.

Figure 4:
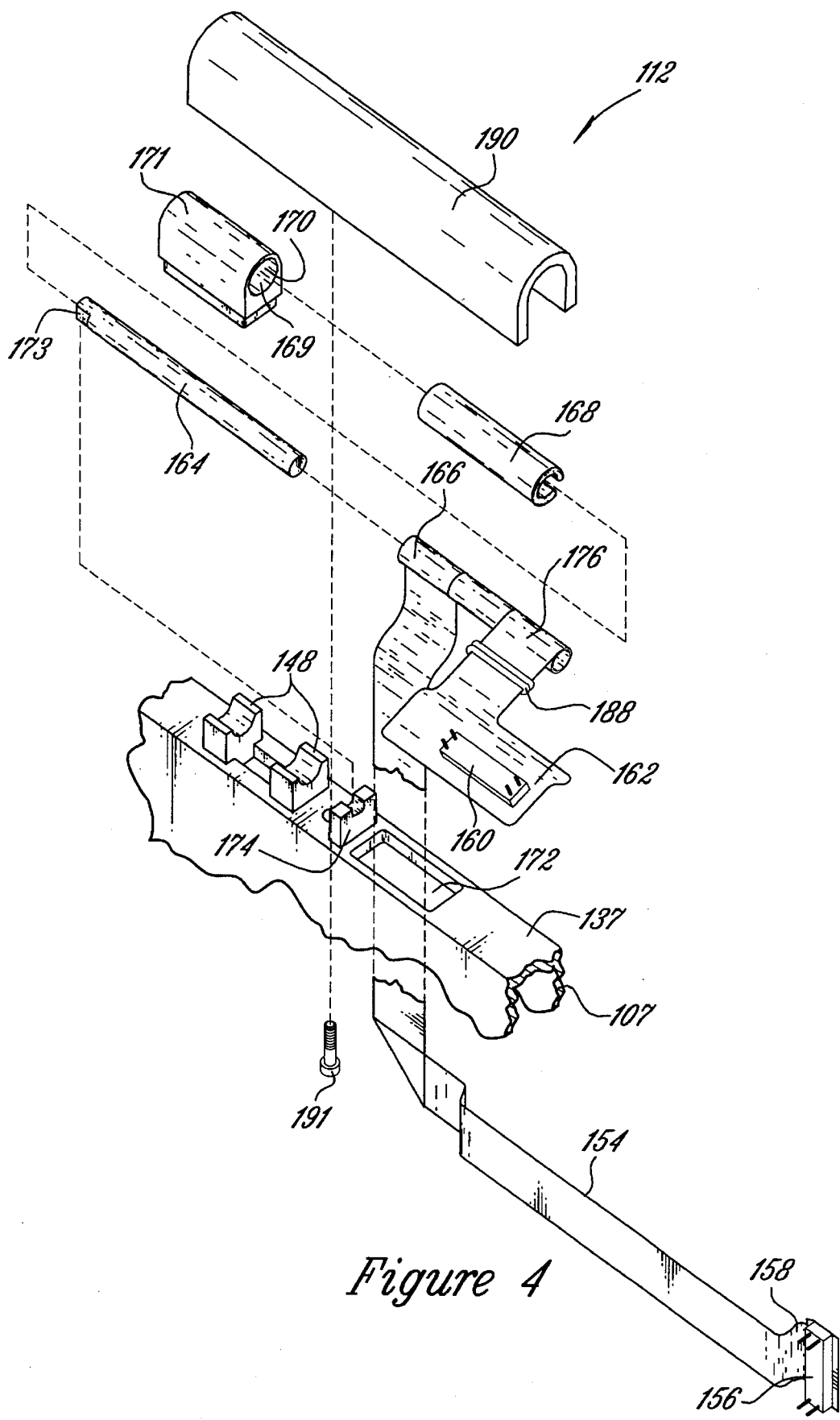
FIG. 4 is an exploded isometric view of the electrical interconnection assembly of FIG. 1.

Referring now to FIGS. 4, 5 and 6, the electrical interconnection assembly 112 provides a means of electrically intercoupling the primary and secondary electrical circuits 104 and 108 without the risk of electrically disconnecting or breaking the conductor after repeated pivoting of the lid 106 with respect to the lower housing 102. An electrical conductor 154 of a flexible web type electrically intercouples the primary electrical circuit 104 and the secondary electrical circuit 108. Lower and upper electrical connectors 156 and 160, electrically connected at lower and upper ends 158 and 162 of the electrical conductor 154, connect or plug into the primary and secondary electrical circuits 104 and 108, all respectively.

A mandrel or rod 164 receives several wraps of the electrical conductor 154. Specifically, a portion of the electrical conductor 154 proximate to the lower end 158 wraps around the rod 164, making at least one complete fixed loop 166. A cover 168, having a C-shaped cross-section, axially receives and partially encircles the rod 164 and the fixed loop 166. A bore 170, extending left to right in a sealing support 171, receives the C-shaped cover 168, the fixed loop 166, and the rod 164. The C-shaped cover 168 maintains the fixed loop 166 about the rod 164 to permit the rod and fixed loop to be readily inserted into the sealing support 171 as the electrical interconnection assembly 112 is assembled. When so assembled, a fixed end 173 of the rod 164 protrudes from a left side of the sealing support 171. A support aperture 172 formed in the upper edge 137 of the rear side 107 fixedly receives a lower portion of the sealing support 171, forming an environmental seal between the sealing support 171 and the rear side 138 of the housing 102. When so received, a rod support 174 projecting upward from the upper edge 137 of the rear side 107, to the left of the support aperture 172, retains the fixed end 173 of the rod 164. Preferably, an upper surface of the rod support 174 is shaped to fixedly retain the fixed end 173 in a tongue-in-groove type arrangement as shown in FIG. 4.

The sealing support 171 includes an electrical conductor slot 169 which opens downward from the bore 170 (shown in FIG. 5). As the electrical interconnection assembly 112 is assembled, the lower end 158 of the electrical conductor 154 is positioned through the bore 170 and then down through the electrical conductor slot 169 and into the lower housing 102 through the support aperture 172.

Another portion of the electrical conductor 154, proximate to the upper end 162, makes at least one complete free loop 176, and preferably two and one-half loops, about a free end of the rod 164, axially offset on the rod from the fixed loop 166. When the lid 106 is in the fully closed position, the last one-half loop of the free loop 176 partially encircles the rod 164 from a bottom of the rod rearward toward a top of the rod, and the electrical conductor 154 extends therefrom toward its upper end 162 within the lid 106. Consequently, as viewed in cross-section from the right side, the free loop 176 (and the fixed loop 166) are wrapped in a counterclockwise direction about the rod 164.

The hinge pin 118 and the rod 164 are substantially in axial alignment with each other, and define an axis of rotation about which the lid 106 pivots. As the lid 106 pivots upward from the fully closed position, the last one-half loop of the free loop 176 of the electrical conductor 154 partially unwraps from the top and rear sides of the rod 164. Conversely, as the lid 106 pivots downward, the free loop 176 of the electrical conductor 164 further wraps around the rod 164. The rod 164 about which the free loop 176 is formed has a sufficiently large radius so as not to produce undue stress on the electrical conductor 154 as the free loop 176 winds and unwinds about the rod 164 when the lid 106 is opened and closed. Pivot forces imposed on the electrical conductor 154 when the lid 106 is pivoted are not focused at a pivot point or line along the electrical conductor 154, rather, the pivot forces are diffused about a portion of the circumference of the rod 164.

The electrical conductor 154 is preferably made of KAPTON™, manufactured by DuPont Corp., and has copper conductors formed therein extending from the lower electrical connector 156 to the upper electrical connector 160. As shown in FIG. 6, a portion of the electrical conductor 154 is formed to have two right-angle bends proximate to the upper end 162, the bends forming a short, horizontal portion between two longer, vertically extending portions that terminate at the upper and lower ends 162 and 158. The horizontal portion axially offsets the fixed and free loops 166 and 176 on the rod 164 and includes a copper pad 180 formed therein.

The copper pad 180 provides at least two benefits. It may be used as a ground plane for the primary and/or secondary electrical circuits 104 and 108. Additionally, the copper pad 180 has sufficient stiffness to set the curvature of the fixed loop 166 about the rod 164, thereby assisting the wrapping of the electrical conductor 154 about the rod 164 during assembly of the electrical interconnection assembly 112. To further aid in assembly, adhesive is applied to several rectangularly shaped areas 181 on one side of the electrical conductor 154 before winding the electrical conductor around the rod 164. The adhesive areas 181 fix approximately two complete loops or wraps of the electrical conductor 154 about the rod 164, partially forming the fixed and free loops 166 and 176. The portion of the electrical conductor 154 between the adhesive areas 181 and the upper end 162 provides the additional one-half wrap of the free loop 176, the portion of the electrical conductor that winds and unwinds as the lid 106 is opened and closed. A reinforcing laminate 182, positioned at each of the upper and lower ends 162 and 158 or the electrical conductor 154, reinforce the electrical conductor 154 and provide a sturdy foundation upon which to connect the upper and lower electrical connectors 160 and 158 to the upper and lower ends 162 and 158 of the electrical conductor, respectively.

The present invention is designed to inhibit water or other contaminants from penetrating into the lower housing 102 or the lid 106. A housing seal 184 (shown in phantom FIG. 1) is retained along the edge of the underside of the lid 106 and is sandwiched between the lid 106 and the lower housing when the lid 106 is pivoted fully downward and retained by a latch 186. The housing seal 112 provides a primary environmental barrier to resist the penetration of water or other fluids into interior of the medical electronic device 100. As an initial environmental barrier for the interconnection assembly 110, a protective cover 190, having a U-shaped cross-section, is fastened to the upper edge 137 of the rear side 107 by a screw 191 (shown in FIG. 4). The protective cover 190 covers the left and right hinge pin supports 148, the friction member 132, the free end 126 of the hinge pin 118, the sealing support 171 and the fixed loop 166. The free end of the rod 164 and the free loop 176 protrude from a right side of the protective cover 190, as shown in FIG. 1. The block seal 146 and the gasket plate 145 seal the friction member opening 136, while the sealing support 171 partially seals the support aperture 172. The C-shaped cover 168 covering the fixed loop 166 substantially fills the bore 170 when received therein, to further prevent water from penetrating into the housing 102 through the support aperture 172 by way of the electrical conductor slot 169.

The above noted seals and gaskets form an environmental seal between the external environment and the interior of the lower housing 102. An elastomeric seal 188, sandwiched between the upper end 162 of the electrical conductor 154 and the lid 106, forms an environmental seal between the external environment exposed to the free loop 176 and the interior of the lid 106.

Figure 8:
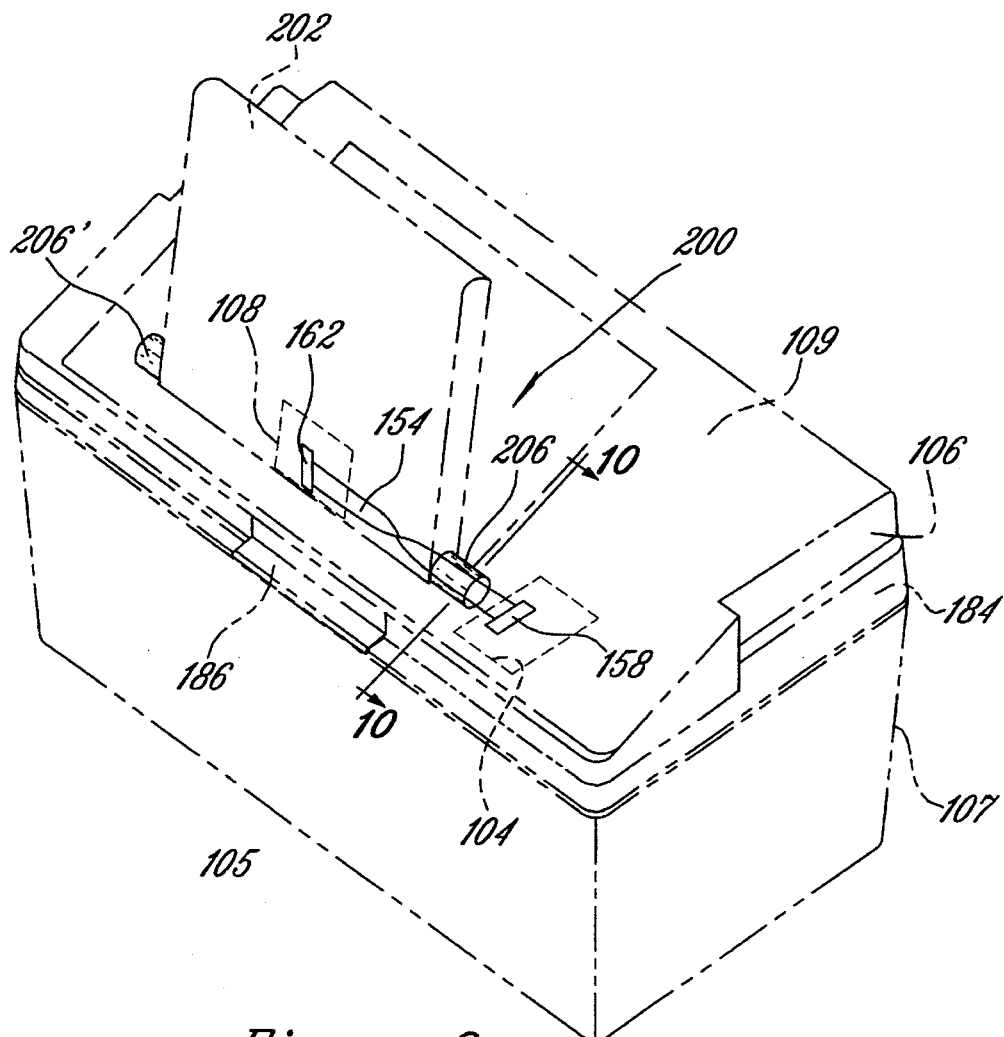
FIG. 8 is a front isometric view of a first alternative embodiment of the present invention.
Figure 9:
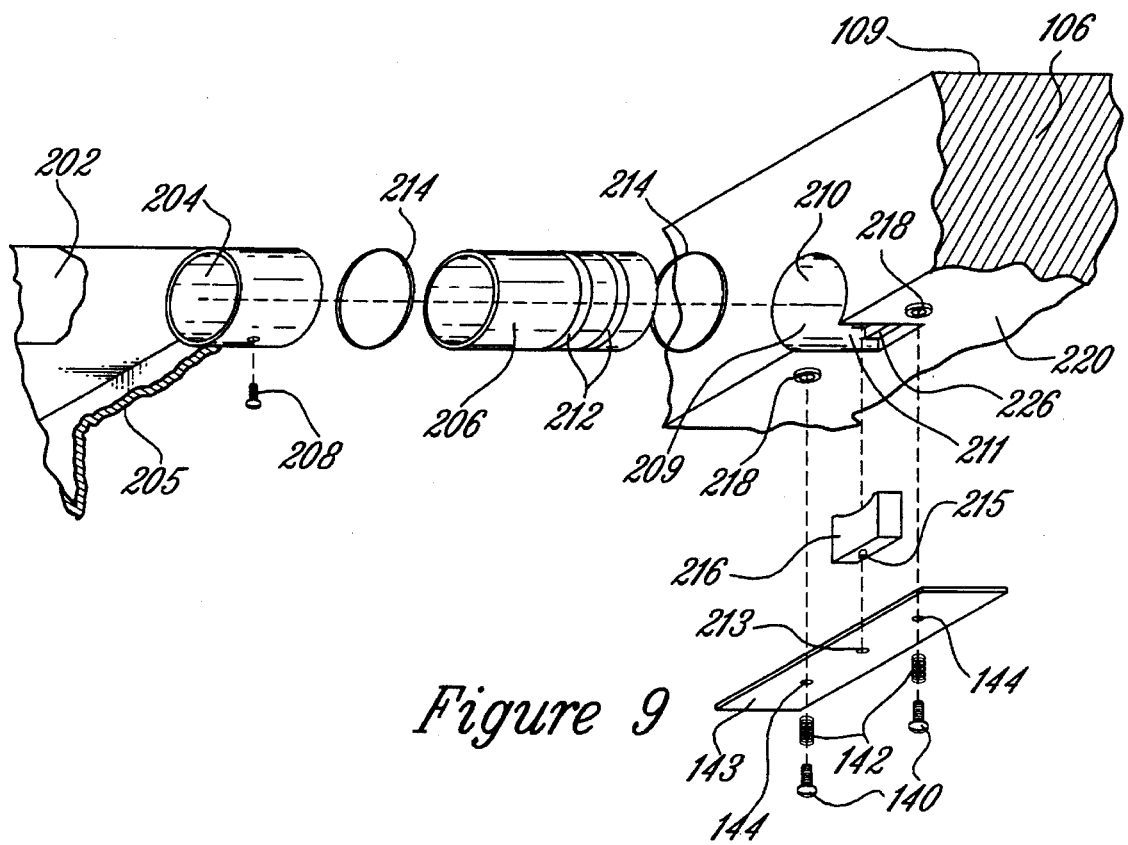
FIG. 9 is a fragmentary, exploded isometric view of the first alternative embodiment of FIG. 8.
Figure 10:
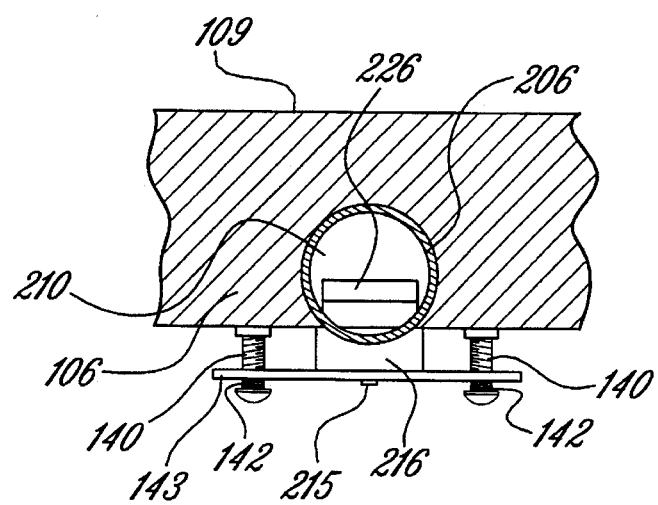
FIG. 10 is a cross-sectional view of the first alternative embodiment taken along the line 10—10 of FIG. 8.

FIGS. 8, 9 and 10 show an alternative embodiment of the present invention having a mechanical and electrical interconnection assembly 200. The mechanical and electrical interconnection assembly 200 may be used for interconnecting, for example, the lid 106 and a display 202. This alternative embodiment is similar to the previously described embodiment, and elements will be similarly numbered when of similar construction. Only the differences in construction will be described in detail.

A tube aperture 204 formed in a lower right hand corner of a display housing 205 of the display 202, axially receives a pivot tube 206. A set screw 208 retains the pivot tube 206 in the tube aperture 204. A lid tube cavity 209 formed in the lid 106, adjacent to the display housing 205, includes a leftward facing lid tube aperture 210 and a downward opening hole 211. The lid tube aperture 210 pivotally receives a free end of the pivot tube 206. A second pivot tube 206' is retained at a lower left hand corner of the display 202, and is pivotally received by a similar lid tube aperture 210 formed in the lid 106. When so received, the pivot tubes 206 and 206' retain the display 202 at the top side 139 of the lid 106. The pivot tubes 206 and 206' permit the display 202 to pivot on the pivot tubes 206 and 206', about the lid tube apertures 210, and define an axis of rotation extending axially between the tubes.

A pair of parallel grooves 212 formed about the external circumference of the pivot tube 206 each receive an O-ring 214. The O-rings 214 provide an environmental seal between the external environment and the interiors of the display 202 and the lid 106.

A friction block hole 213, centrally formed in the retaining plate 143, fixedly receives a tab 215 extending downward from a friction block 216. A pair of the adjusting members or screws 140, each axially receiving one of the springs 142, are positioned through the screw holes 144 formed in the retaining plate 143 on opposing sides of the friction block hole 213. A pair of retaining holes 218 formed in an undersurface 220 of the lid 106 on opposing sides at the hole 211 receive the screws 140. When so received, a curved upper surface of the friction block 216 is positioned at the hole 211, and against the pivot tube 206, a portion of which extends downward through the hole 211.

As the screws 140 are tightened, the friction block 216 is drawn upward and against the pivot tube 206, causing frictional forces between the friction block 216 and the tube 106 to increase. The friction block 216 is preferably made of ACETAL, and the pivot tube 206 is preferably made of stainless steel, these two materials providing a balance between increased friction and decreased wear therebetween.

The electrical conductor 154 is positioned through the pivot tube 206 and along the axis of rotation between the pivot tubes 206 and 206', intercoupling the primary electrical circuit 104 located within the lid 106 and the secondary electrical circuit 108 located within the display housing 205. As shown in FIG. 8, when the display 202 pivots upward, the electrical conductor 154 twists helically with respect to the pivot tube 206, partially forming a helical or longitudinal-type loop along a central length of the electrical conductor 154 about the axis of rotation.

A retaining block 226 is fixed to an upper right corner of the tube cavity 209. As the screws 140 are tightened, a left-hand edge of the retaining plate 143 retains or pinches the lower end 158 of the electrical conductor 154 within a slot in the retaining block 226. A similar retaining block 226 retains the upper end 162 of the electrical conductor 154 within the display housing 205. When so retained against the retaining blocks 226, the electrical conductor is prohibited from pivoting at its lower or upper ends 158 or 162, thus eliminating the risk of disconnecting the lower or upper electrical connectors 156 or 160 from the primary or secondary electrical circuits 104 or 108, all respectively. The retaining block 226 is preferably made of a resilient material having a high coefficient of friction, such as silicone rubber. The electrical conductor 154 is permitted to twist only at the central length between the retaining blocks 226.

Pivotal movement of the display 202 is restricted to a maximum of 180° by the display contacting the lid 106 at either a 0° or 180° position. Pivoting the display 202 from the 0° to the 180° position causes the central portion of the electrical conductor 154 to move from a flat position to a half-twisted position. Any pivoting forces are exerted along this central portion, a relatively great length of the electrical conductor 154 compared to the sharp axis of rotation.

The present invention describes the mechanical and electrical interconnection assembly 110 which allows two electrical devices to be pivotally interconnected without fear of breaking the electrical conductor positioned between the two devices. The flexible web-type electrical conductor 154 winds and unwinds rather than pivoting on an axis. Consequently, any pivot forces placed on the lid 106 or the display 202 are not focused at the single pivot axis. Instead, the pivot forces are diffused or spread about the sufficiently large radius of the rod 164 in the first embodiment, and along a long central length of the electrical conductor 154 in the alternative embodiment.

The design and selection of materials used in the friction assembly of the present invention allows the lid 106 or the display 202 to be pivoted and held in a variety of positions, even after a great number of actuations. The amount of force required to pivot the lid 106 or the display 202 does not significantly increase or decrease, and the mechanical interconnection assembly 111 need not be adjusted or replaced during the life of the portable electronic device 100.

Furthermore, the portable electronic device 100 of the present invention is environmentally secure. The gasket plate 145, the seal block 145, the seal 178 and the sealing support 171 seal the openings formed in the lower housing 102 and the lid 106 to accommodate the interconnection assembly 110. The O-rings 214 in the alternative embodiment provide a similar benefit.

Although specific embodiments of the invention have been described for purposes of illustration, various modifications may be made without parting from the spirit and scope of the invention, as is known by those skilled in the relevant art. Accordingly, the invention is not limited by the disclosure, but instead its scope is to be determined entirely by reference to the following claims.

I claim:

1. A mechanical and electrical assembly for interconnecting first and second housings enclosing respective first and second electrical components, the first and second housings respectively formed with first and second apertures extending from the exterior to the interior of the housings, the assembly comprising:

a pivot assembly pivotally coupling the first and second housings together for pivoting movement of the first and second housings relative to each other about an axis of rotation;

a friction assembly coupled to at least one of the first and second housings for holding the first and second housings in a plurality of pivoted angular orientations with respect to each other;

an electrical conductor of a flexible web type coupled through the first aperture to the first electrical component at a first end and coupled through the second aperture to the second electrical component at a second end, a central portion of the electrical conductor rotating about the axis of rotation, so that the electrical conductor wraps or unwraps about the axis of rotation as the first and second housings pivot with respect to each other, the first end being axially offset from the second end; and first and second environmental seal members positioned about the first and second ends of the electrical conductor, respectively, and positioned in the respective first and second apertures in the first and second housings, the environmental seal members providing a barrier between the interior and the exterior of the housings.

2. The assembly of claim 1, further comprising a rod retained between the first and second housings approximately at the axis of rotation, the central portion of the electrical conductor wrapped about the rod in at least one complete loop, the first end wrapping and unwrapping from the rod as the first and second housings pivot with respect to each other.

3. The assembly of claim 2 wherein at least one complete loop of the electrical conductor is fixed to the rod and a one-half loop wraps and unwraps from the rod.

4. The assembly of claim 1 wherein the pivot assembly includes at least one pivot tube axially positioned at the axis of rotation, the central portion of the electrical conductor being positioned through the pivot tube and helically twisting about the axis of rotation as the first and second housings pivot with respect to each other.

5. The assembly of claim 4, further comprising first and second retaining members respectively retaining the first and second ends in the first and second housings, the first and second retaining members defining the central portion of the electrical conductor therebetween.

6. A mechanical and electrical assembly for interconnecting first and second housings enclosing respective first and second electrical components, the first and second housings respectively formed with first and second apertures extending from the exterior to the interior of the housings, said assembly comprising:

a pivot assembly pivotally coupling the first and second housings together for pivoting movement of the first and second housings relative to each other about an axis of rotation;

an electrical conductor of a flexible web type coupled through the first aperture to the first electrical component at a first end and coupled through the second aperture to the second electrical component at a second end, a first portion of the electrical conductor being wrapped in at least one complete loop having an axis that is substantially coincident with the axis of rotation of the pivot assembly so that the electrical conductor winds and unwinds as the first and second housings pivot with respect to each other, the first end being axially offset from the second end; and first and second environmental seal members positioned about the first and second ends of the electrical conductor, respectively, and positioned in the respective first and second apertures in the first and second housing, the environmental seal members providing a barrier between the interior and the exterior of the housings.

7. The assembly of claim 6 wherein the pivot assembly includes a first hinge member and a second hinge member, the first hinge member coupled to one of the first and second housings and the second hinge member coupled to the other of the first and second housings, the first hinge member being rotatable relative to the second hinge member about the axis of rotation.

8. The assembly of claim 7 wherein the first hinge member is a hinge pin and the second hinge member is at least one hinge pin support formed in the other of the first and second housings.

9. The assembly of claim 7, further comprising a friction assembly having a friction member and an adjusting member, the friction member in frictional contact with the first hinge member, and the adjusting member coupled between the friction member and the other of the first and second housings, the adjusting member for adjusting an amount of frictional contact between the friction member and the first hinge member.

10. The assembly of claim 9 wherein the first hinge member is a hinge pin and the second hinge member is at least one hinge pin support formed in the other of the first and second housings, wherein the friction member includes a head portion at least partially encircling the hinge pin and a fastening portion, and wherein the adjusting member is adjustably fastened to the fastening portion, the friction assembly further comprising a plate in contacting position between the other of the first and second housings and the adjusting member.

11. The assembly of claim 10 wherein the friction assembly further comprises a bushing in contacting position between the hinge pin and the head portion, the bushing being of a first material, the hinge pin being of a second material and the head portion being of a third material, the first material dissimilar to the second and third materials.

12. The assembly of claim 6, further comprising a rod, a second portion of the electrical conductor wrapped about the rod in at least one complete loop and axially offset from the first portion, the rod retained between the first and second housings approximately at the axis of rotation.

13. The assembly of claim 12, further comprising a cover partially encircling the second portion of the electrical conductor and the rod, the cover received by one of the first and second seals.

14. The assembly of claim 12, further comprising a cover fixed to one of the first and second housings, the cover partially covering the pivot assembly and the second portion of the electrical conductor.

15. A mechanical and electrical assembly for interconnecting first and second housings enclosing respective first and second electrical components, the assembly comprising:

a pivot assembly pivotally coupling the first and second housings together for pivoting movement of the first and second housings relative to each other about an axis of rotation, the pivot assembly comprising:
  a tube and a tube guide, the tube coupled to one of the first and second housings and the tube guide coupled to the other of the first and second housings, the tube being rotatable relative to the tube guide about the axis of rotation; and
  an environmental seal member positioned about the tube; and
an electrical conductor of a flexible web type coupled to the first electrical component at a first end and the second electrical component at a second end and extending through the pivot assembly tube, a central portion of the electrical conductor helically rotating about the axis of rotation so that the electrical conductor moves from an approximately flat first position to a partially twisted second position about the axis of rotation as the first and second housings pivot with respect to each other, the first end being axially offset from the second end.

16. The assembly of claim 15; further comprising a friction assembly having a friction member and an adjusting member, the friction member in frictional contact with the tube, and the adjusting member coupled between the friction member and the other of the first and second housings, the adjusting member for adjusting an amount of frictional contact between the friction member and the tube.

17. The assembly of claim 16 wherein the friction assembly includes a plate receiving the friction member and in contacting position between the other of the first and second housings and the adjusting member.

18. The assembly of claim 17 wherein the adjusting member is at least one adjustable fastener retaining the friction member in frictional contact with the tube.

19. The assembly of claim 15 wherein the central portion of the electrical conductor is positioned through the tube.

20. The assembly of claim 19, further comprising first and second retaining members respectively retaining the first and second ends in the first and second housings, the first and second retaining members defining the central portion of the electrical conductor therebetween.

* * * * *